(12) United States Patent
Nazarian et al.

(10) Patent No.: US 9,362,293 B2
(45) Date of Patent: Jun. 7, 2016

(54) CT-NOR DIFFERENTIAL BITLINE SENSING ARCHITECTURE

(71) Applicant: Spansion LLC, Sunnyvale, CA (US)

(72) Inventors: Hagop Nazarian, San Jose, CA (US);
Richard Fastow, Cupertino, CA (US);
Lei Xue, Saratoga, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 129 days.

(21) Appl. No.: 14/135,863

(22) Filed: Dec. 20, 2013

(65) Prior Publication Data

US 2015/0179656 A1 Jun. 25, 2015

(51) Int. Cl.
*H01L 27/115* (2006.01)
*G11C 16/10* (2006.01)
*H01L 21/66* (2006.01)

(52) U.S. Cl.
CPC .............. *H01L 27/115* (2013.01); *G11C 16/10* (2013.01); *H01L 22/14* (2013.01)

(58) Field of Classification Search
CPC .................................................. G11C 16/0483
USPC .................................................. 365/189.17
See application file for complete search history.

(56) References Cited

U.S. PATENT DOCUMENTS

| | | | |
|---|---|---|---|
| 6,185,147 B1 | 2/2001 | Liu | |
| 7,272,062 B2 | 9/2007 | Taddeo | |
| 7,342,840 B2 | 3/2008 | Tran | |
| 7,471,581 B2 | 12/2008 | Tran et al. | |
| 7,684,274 B2 | 3/2010 | Rengarajan et al. | |
| 7,835,189 B2 | 11/2010 | Achter et al. | |
| 7,869,281 B2 | 1/2011 | Nazarian | |
| 8,040,738 B2 | 10/2011 | Nazarian et al. | |
| 8,120,939 B2 | 2/2012 | Liaw | |
| 8,134,853 B2 | 3/2012 | Fastow et al. | |
| 8,270,244 B2 | 9/2012 | Kim | |
| 8,559,261 B2 | 10/2013 | Kim | |
| 2010/0172189 A1* | 7/2010 | Itagaki | G11C 16/0483 365/185.29 |
| 2011/0149630 A1* | 6/2011 | Fastow | G11C 16/26 365/72 |
| 2013/0039139 A1 | 2/2013 | Raval et al. | |
| 2013/0223136 A1 | 8/2013 | Chuang et al. | |
| 2013/0250683 A1* | 9/2013 | Hosono | G11C 16/0483 365/185.05 |
| 2013/0258782 A1 | 10/2013 | Tatsumura et al. | |

OTHER PUBLICATIONS

International Search Report for International Application No. PCT/US20141071369 dated Apr. 1, 2015; 2 pages.
Written Opinion of the International Searching Authority for International Application No. PCT/US2014/071369 dated Apr. 1, 2015; 6 pages.

* cited by examiner

*Primary Examiner* — Hoai V Ho
*Assistant Examiner* — Minh Dinh

(57) ABSTRACT

Providing for a non-volatile semiconductor memory architecture that achieves high read performance is described herein. In one aspect, an array of memory transistors arranged electrically in serial is configured to control a gate voltage of a pass transistor. The pass transistor, in turn, enables current flow between two metal bitlines of the semiconductor memory architecture. Accordingly, a relative voltage or relative current of the two metal bitlines can be measured and utilized to determine a program or erase state of a transistor of the serial array of transistors. In a particular aspect, a transistor with small capacitance is chosen for the pass transistor, resulting in a fast correspondence of the pass transistor gate voltage/current relative to transistor array current. This can equate to fast read times for the transistor array, based on differential sensing of the two metal bitlines.

18 Claims, 10 Drawing Sheets

DIMENSIONS IN MICROMETERS

CT-NOR DIFFERENTIAL BITLINE SENSING ARCHITECTURE

BACKGROUND

Memory devices have a wide range of uses in modern electronics and electronic devices. In general, various types of electronic memory exist, including hard disc memory, floppy disc memory, magnetic tape memory, optical disk memory, and so on. One of the more innovative and diversified types of memory is semiconductor memory.

One type of semiconductor memory commonly used for modern electronics is nonvolatile Flash memory. Flash memory comprises arrays of semiconductor memory transistors that can be utilized to store, erase and re-store digital information. Compared to other types of electronic memory, Flash memory is fast both in terms of programming and erasing, as well as reading data, has good data retention characteristics, and is highly cost effective. Accordingly, Flash memory is utilized for data storage in an ever-increasing number of electronic devices and applications, including computers, cell phones, smart-phones, digital cameras and camcorders, game stations, and so forth.

Early forms of semiconductor memory required continuous access to electrical power to enable data retention. For instance, volatile semiconductor memory requires an external voltage to be applied on one region of a memory transistor to maintain a stored charge in another region of the memory transistor. If the external voltage drops below a required level, the stored charge is lost. For a volatile memory device, such as random access memory (RAM), the lost charge results in lost data. Although volatile semiconductor memory has significant advantages, including high program and read speeds, the threat of data loss has made volatile semiconductor memory suitable primarily for RAM applications, especially given non-volatile mass storage alternatives such as hard drives, disc drives, and so on.

One great advantage of Flash memory is that stored data can be retained without continuous electrical power applied to a Flash memory module. In addition, Flash memory is a solid-state technology that can be very dense—in terms of memory cells per unit volume—typically requiring no moving parts for basic operation. Accordingly, Flash memory is ideal as removable and portable data storage for consumer electronics, and is utilized with universal interface technologies for a wide array of electronic devices, such as universal serial bus (USB) technology. The non-volatile nature of Flash memory suggests employing Flash for RAM applications. However, RAM is typically faster and more compact than Flash, and consumes relatively low power. Thus, additional improvements in Flash density and speed would be required to employ Flash memory as a RAM replacement in many devices and applications.

One area where Flash has made successful inroads is in hard disc replacement. Hard discs are non-volatile and have very high storage capacity, but often have slower read and write times than Flash memory devices and have moving mechanical parts that are much less shock resistant than semiconductor-based memory. Accordingly, computer and electronic devices can achieve performance and reliability improvements when utilizing a non-volatile semiconductor hard drive, such as a Flash hard drive.

To achieve performance improvements, new designs generally aim to reduce time required to program, erase and read Flash memory cells. This equates to faster memory access times, a desired trait for digital memory. Another goal is to provide improved memory density; in effect increasing a number of storable bits per volume of semiconductor space. Yet another goal of Flash memory research is to improve data retention capability, mitigating data loss that occurs over time. And of course, a general goal is to provide a suitable aggregate of the foregoing or similar improvements (e.g., scalability, multi-layer capability, power consumption, or the like), yielding a Flash memory device that is highly preferable for various electronic device applications.

Because different Flash memory designs have different characteristics, however, utilizing one design may provide fast program and erase times, but slow read times. Another design may provide fast read times, but slow program times, or reduced data longevity, and so on. One objective of the subject disclosure is to provide a Flash memory device that provides an aggregate of advantages of conventional Flash memory. Another objective is to provide Flash memory that has fast program, erase and read times, compared with conventional Flash memory, with similar or improved memory density. Yet another objective is to provide a mechanism for fabricating improved Flash memory based on the foregoing objectives.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

In various aspects of the subject disclosure, provided is a non-volatile semiconductor memory architecture that achieves improved performance relative conventional semiconductor memory. In one aspect, a semiconductor memory architecture is disclosed in which an array of transistors arranged electrically in serial controls a gate current or voltage of a pass transistor (also referred to herein as a toggle transistor). The pass transistor, in turn, electrically isolates or connects two metal bitlines of the semiconductor memory architecture. Accordingly, a relative voltage or relative current of the two metal bitlines can be measured and utilized to determine a program or erase state of a transistor of the serial array of transistors. In a particular aspect, a transistor with small capacitance is chosen for the pass transistor, resulting in a fast correspondence of the pass transistor gate voltage/current relative to transistor array current. This can equate to fast read times for the transistor array, based on differential sensing of the two metal bitlines.

In other aspects of the subject disclosure, a plurality of transistor arrays can be coupled to a pass transistor for differential sensing. For instance, in one specific aspect, a pair of transistor arrays can be alternatively coupled to a single pass transistor gate. Select transistors formed in respective arrays can be utilized to isolate or connect one or the other of the pair of transistors to the pass transistor gate, to facilitate reading a program or erase state of one or more transistors of a particular array of transistors. In at least one aspect, a depletion region can be utilized in conjunction with one or more select transistors to facilitate connecting only a single of the plurality of transistor arrays to the pass transistor gate at a given time.

According to a further aspect of the subject disclosure, at least four transistor arrays can be coupled to a single pass transistor. This provides improved memory density by reducing a number of pass transistors employed for a given number of transistor arrays. More particularly, in a further aspect, a first subset of the at least four transistor arrays can be formed in one transistor block, whereas a second subset of the at least four transistor arrays can be formed in another transistor block. A combination of select transistors and block transistors can be employed to select (or activate) one or the other transistor block—thereby activating the first subset or second subset of transistor arrays—and to select respective transistor arrays of the respective subsets. A selected transistor array is electrically coupled to the gate of the single pass transistor, and can be read via differential sensing of two metal bitlines coupled to opposite ends of a channel region of the single pass transistor.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
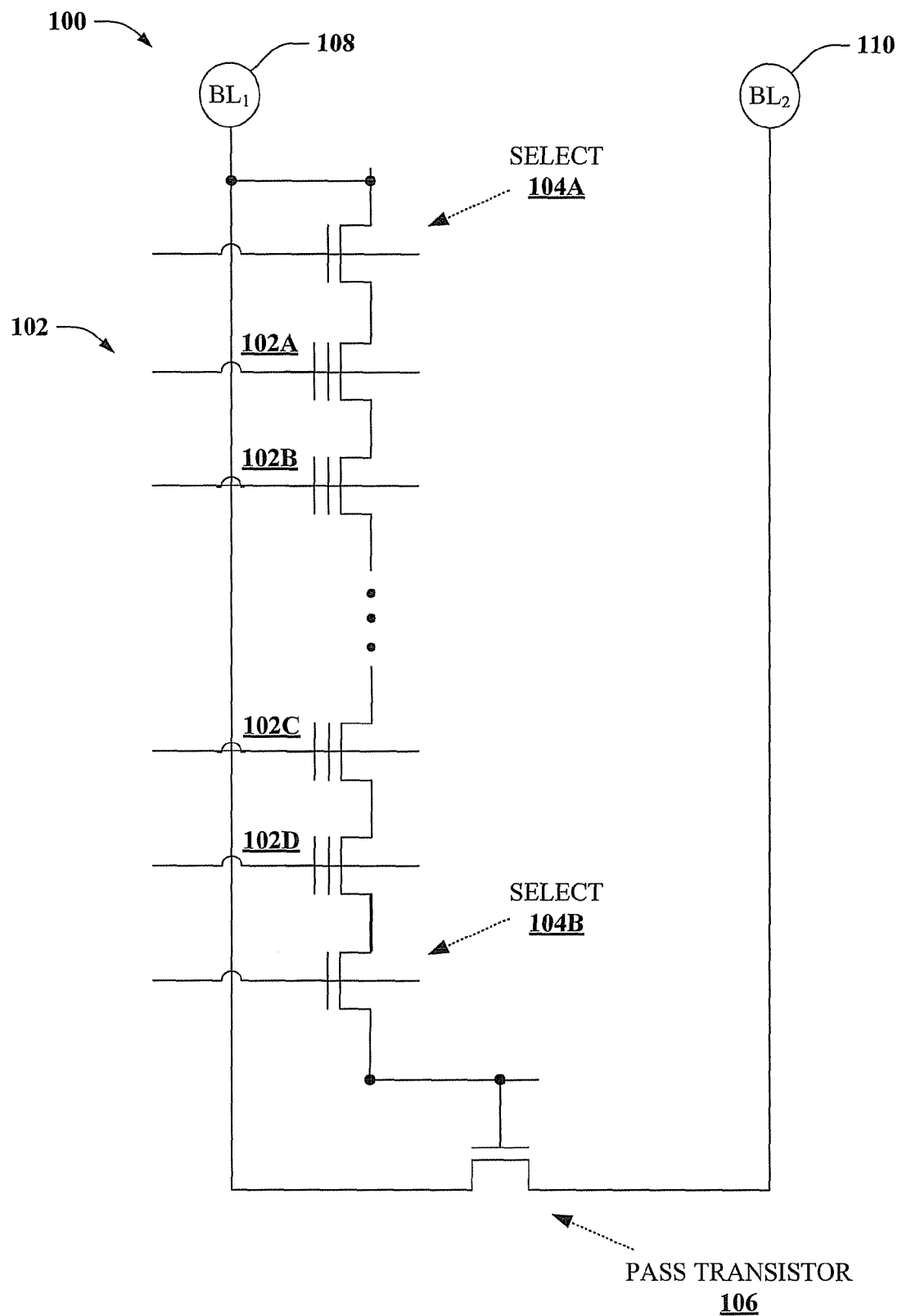
FIG. 1 illustrates a schematic diagram of an example semiconductor memory architecture according to aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

As utilized herein, terms "component," "system," "architecture" and the like are intended to refer to a computer or electronic-related entity, either hardware, a combination of hardware and software, software (e.g., in execution), or firmware. For example, a component can be one or more semiconductor transistors, an arrangement of semiconductor transistors, a processor, a process running on the processor, an object, executable, program or application accessing the semiconductor memory, or a computer, or the like. The component can include erasable programming (e.g., process instructions at least in part stored in erasable memory) or hard programming (e.g., process instructions burned into non-erasable memory at manufacture). By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware.

Furthermore, the claimed subject matter can be implemented as a method, apparatus, or article of manufacture using typical manufacturing, programming or engineering techniques to produce hardware, firmware, software, or any combination thereof to control an electronic device to implement the disclosed subject matter. The term "article of manufacture" as used herein is intended to encompass an electronic device, a semiconductor device, a computer, or a computer program accessible from any computer-readable device, carrier, or media. Computer-readable media can include hardware media, or software media. In addition, the media can include storage media, or transport media. For example, computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, signal interface modules (e.g., a wireless communication interface), or the like. Of course, those skilled in the art will recognize many modifications can be made to this configuration without departing from the scope or spirit of the claimed subject matter.

The subject disclosure relates to improved non-volatile memory. In some aspects, a semiconductor memory architecture is provided for differential sensing of memory transistors. Differential sensing, as utilized herein, relates to measuring a difference in an electrical characteristic of two non-grounded conductors in the semiconductor memory architecture. Measuring the difference in electrical characteristic can result in fast measurements relative to measuring grounded resistors, for instance, particularly where resistance or capacitance between the non-grounded conductors is low. In this case, changes in the electrical characteristic can be rapidly measured. Where the changes in the electrical characteristic are related to voltage or current in an array of memory transistors, the rapid measurements can equate to rapid read times for memory transistors of the array. Where this type of differential sensing is employed with memory transistors that conventionally have fast program and erase times, such as NAND or NOR transistor arrays, the result is a memory architecture with program, erase and read times greatly improved over conventional memory, at least in the aggregate.

According to various aspects of the subject disclosure, different memory architectures are provided for improving memory density in conjunction with a differential sensing arrangement. As utilized herein, the term memory density refers to a number of data storage transistors for a given volume of semiconductor memory. One way memory density can be improved, therefore, is by reducing a number of non-data storage transistors (e.g., select transistors, pass transistors, and so on) employed by the memory architecture, increasing a number of data storage transistors that can be formed in the given volume. Thus, in one aspect, a disclosed memory architecture couples at least two memory transistor arrays to a single pass transistor designed to reflect a program or erase state of transistors of the memory transistor arrays. In another aspect, a memory architecture couples at least four memory transistor arrays to the pass transistor. These aspects improve memory density by reducing a number of pass transistors utilized per array of memory transistors.

Referring now to FIG. 1, depicted is an example schematic diagram of a semiconductor memory architecture 100 according to aspects of the subject disclosure. Particularly, semiconductor memory architecture 100 provides optimal program, erase and read speed as compared with conventional memory architectures. Reading data stored by the memory architecture comprises differential sensing of at least two non-grounded conductors, a relatively fast operation compared with sensing a grounded conductor. In addition, memory architecture 100 comprises memory transistors arranged electrically in serial to provide fast program and erase speeds. Accordingly, semiconductor memory architecture 100 can achieve optimal program and erase speeds, as well as greatly improved read speeds compared with conventional memory, providing a significant improvement thereof. Program and erase operations are improved with the architecture since both program and erase operations involve a verification phase which involves read. Therefore, by speeding up the operation program and erase operations are also improved compared to conventional approaches.

Semiconductor memory architecture 100 can comprise an array 102 of memory transistors (e.g., data storage transistors, single-bit transistors, multi-bit transistors, and so on), arranged electrically in serial along respective channel regions thereof (e.g., from source to drain). Individual memory transistors of array 102 are denoted at 102A, 102B, 102C and 102D. It should be appreciated that although four memory transistors are depicted in array 102, this number of memory transistors is not required, and more or fewer memory transistors can be included in array 102 instead (e.g., 1, 2, 8, 12, 24, 32, 64, etc.). At one end of array 102 is a select transistor 104A configured to electrically connect or isolate array 102 from a first metal bitline 108 (hereinafter referred to as $BL_1$ 108). Generally, $BL_1$ 108 can be employed as a power source for array 102, when coupled with a voltage or current source for instance, or can also be employed as a ground for array 102 (e.g., when coupled with a suitable ground of semiconductor memory architecture 100—not depicted). By applying a suitably configured voltage to $BL_1$ 108 and to array 102, one or more transistors of the array can be programmed to a memory state, erased, or read as is described in more detail hereinafter.

Additionally, at an opposite end of array 102 is another select transistor 104B configured to electrically isolate or connect array 102 with a gate of a pass transistor 106. Pass transistor gate voltage is modulated by array 102, therefore, when select transistor 104B is conducting. As is depicted, $BL_1$ 108 and a second metal bitline, $BL_2$ 110, are respectively coupled to opposing ends of a channel region (e.g., to source and drain, respectively) of pass transistor 106. If the gate voltage of pass transistor 106, modulated by array 102, exceeds a threshold voltage, pass transistor 106 will become conductive, allowing current to flow between $BL_1$ 108 and $BL_2$ 110. This will further induce a change in a relative current and relative voltage of $BL_1$ 108 and $BL_2$ 110 (e.g., where relative voltage $V_L$=voltage of $BL_1$–voltage of $BL_2$; relative current $C_L$=current of $BL_1$–current of $BL_2$, etc.). As a result, a change in the relative voltage or relative current is related to the gate voltage of pass transistor 106, which in turn is modulated by current flow in array 102. Accordingly, a program or erase state of a memory transistor 102A, 102B, 102C, 102D of array 102 can be determined based on the change in relative voltage or relative current of $BL_1$ 108 and $BL_2$ 110.

A sensing transistor (not depicted) can be coupled to $BL_1$ 108 and $BL_2$ 110 to measure relative changes in an electrical characteristic(s) of the metal bitlines. These changes can typically occur more quickly than a memory architecture in which memory transistor state is measured at a grounded metal bitline. This characteristic of the relative electrical characteristic(s) can lead to improved read times over the memory architecture employing the grounded metal bitline. In at least one aspect of the subject disclosure, resistance in $BL_1$ 108 or $BL_2$ 110 is minimized to increase a rate at which the relative electrical characteristic(s) changes in response to pass transistor 106 transitioning from a conductive to an insulating state, or vice versa. These aspects can further improve read times of semiconductor memory architecture 100 over conventional semiconductor memory.

Figure 2:
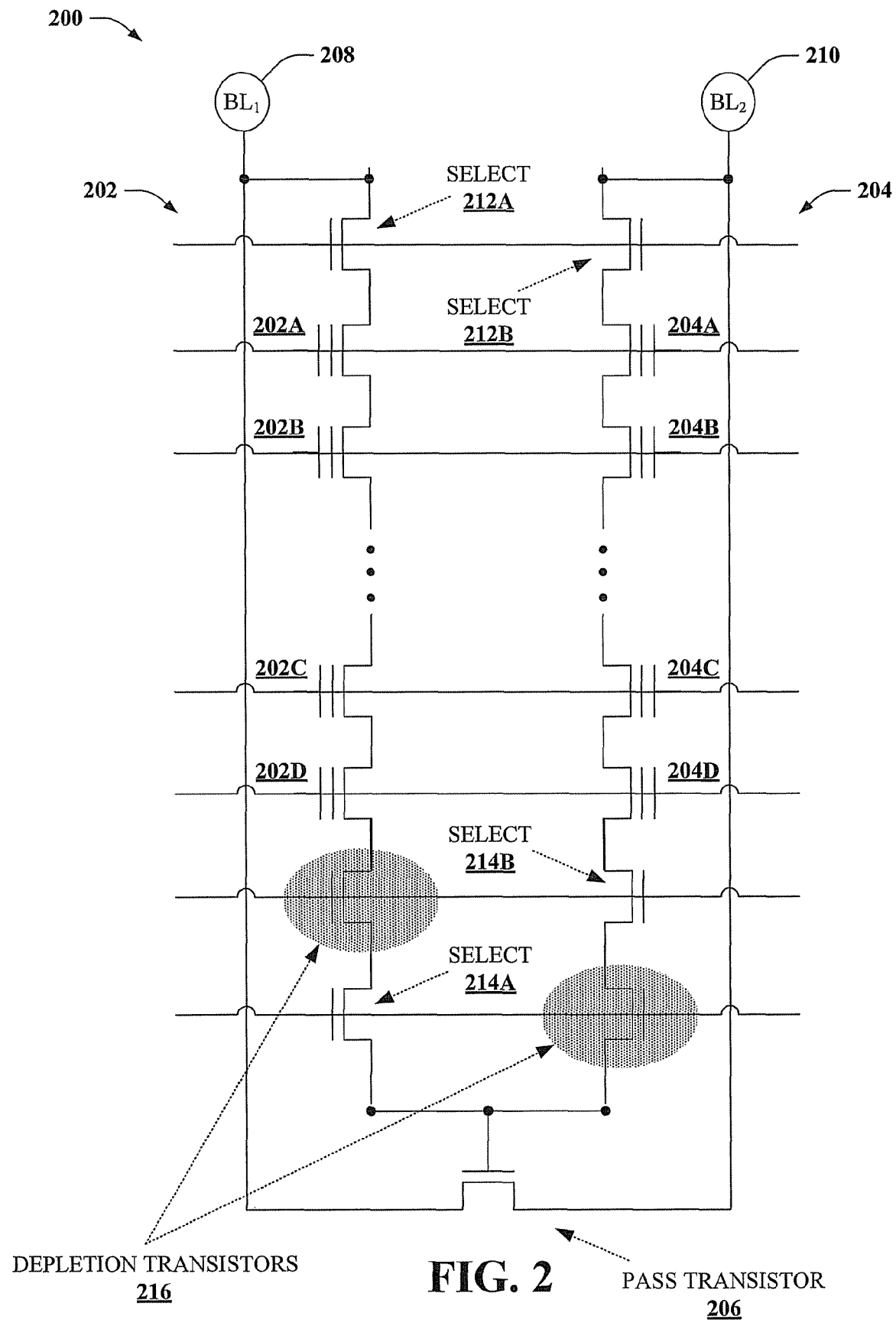
FIG. 2 depicts a schematic diagram of a sample semiconductor memory architecture comprising differential sensing for two transistor arrays.

FIG. 2 depicts a schematic diagram of a semiconductor memory architecture 200 according to additional aspects of the subject disclosure. Semiconductor memory architecture 200 is configured to provide increased memory density over the semiconductor memory architecture 100, described above. Particularly, semiconductor memory architecture 200 is configured to reduce a ratio of pass transistors to memory transistor arrays to about two arrays per one pass transistor.

As depicted, semiconductor memory architecture 200 can comprise a first array 202 comprising memory transistors 202A, 202B, 202C, 202D (referred to collectively as memory transistors 202A-202D), and a second array 204 comprising memory transistors 204A, 204B, 204C, 204D (referred to collectively as memory transistors 204A-204D). Additionally, first array 202 and second array 204 are coupled to a gate of a pass transistor 206. Select transistors 214A and 214B can be employed to electrically isolate or connect first array 202 or second array 204 to the gate of pass transistor 206. When electrically connected, a gate voltage of pass transistor 206 is modulated by current flow in first array 202 or second array 204.

In at least one aspect of the subject disclosure, a pair of depletion transistors 216 can be formed at first array 202 and second array 204 as depicted. Depletion transistors 216 can be formed by injecting conducting material within regions of active bitlines of semiconductor memory architecture 200 in which first array 202 and second array 204 are formed, as depicted by the oval shaded areas. Note that these shaded ovals are not indicative of an actual area in which the conducting material is injected, but are rather intended to highlight the depletion transistors with respect to active transistors, such as memory transistors 202A-202D, 204A-204D and select transistors 214A, 214B.

In operation, select transistors 214A and 214B to electrically isolate either array 202 or array 204 from the gate of pass transistor 206. The depletion transistors 216 and pass transistor 206 facilitate utilizing a continuous gate layer and constant gate layer pitch. Particularly, a gate of select transistor 214A can be set at a voltage that causes select transistor 214A to be non-conducting—electrically isolating first array 202 from the gate of pass transistor 206—without stopping current flow in second array 204 (because the channel region of the depletion transistor in the active bitline of array 204 is permanently conductive). Further, a gate of select transistor 214B can then be set to a voltage that causes select transistor 214B to be conducting, thereby electrically connecting second array 204 to the gate of pass transistor 206. In this manner, first array 202 can be isolated from pass transistor 206 while second array 204 is connected to pass transistor 206. In the alternative, select transistor 214A can be set to conducting and select transistor 214B can be set to non-conducting (without stopping current flow in first array 202 because the depletion transistor is permanently conducting), to electrically connect first array 202 with pass transistor 206, and electrically isolate second array 204 from pass transistor 206.

First array 202 also includes a select transistor 212A configured to electrically connect or isolate first array 202 from a first metal bitline $BL_1$ 208. Likewise, second array 204 includes a select transistor 212B that electrically connects or isolates second array 204 from a second metal bitline $BL_2$ 210. Select transistors 212A and 212B can be utilized to apply a voltage to first array 202 and second array 204, respectively, via $BL_1$ 208 and $BL_2$ 210. Based on a magnitude and sequence of the voltage applied, memory transistors of the respective arrays can be programmed, erased or read, or alternatively can be isolated from program/erase/read operations of other memory transistors (not depicted) of semiconductor memory architecture 200.

To read a memory transistor of first array 202 or second array 204, one of the arrays is electrically connected to the gate of pass transistor 206, as described above. Changes in relative current or voltage on $BL_1$ 208 versus $BL_2$ 210 can be measured. These measurements in turn can be utilized to determine a program or erase state of a memory transistor(s) of the electrically connected array.

Figure 3:
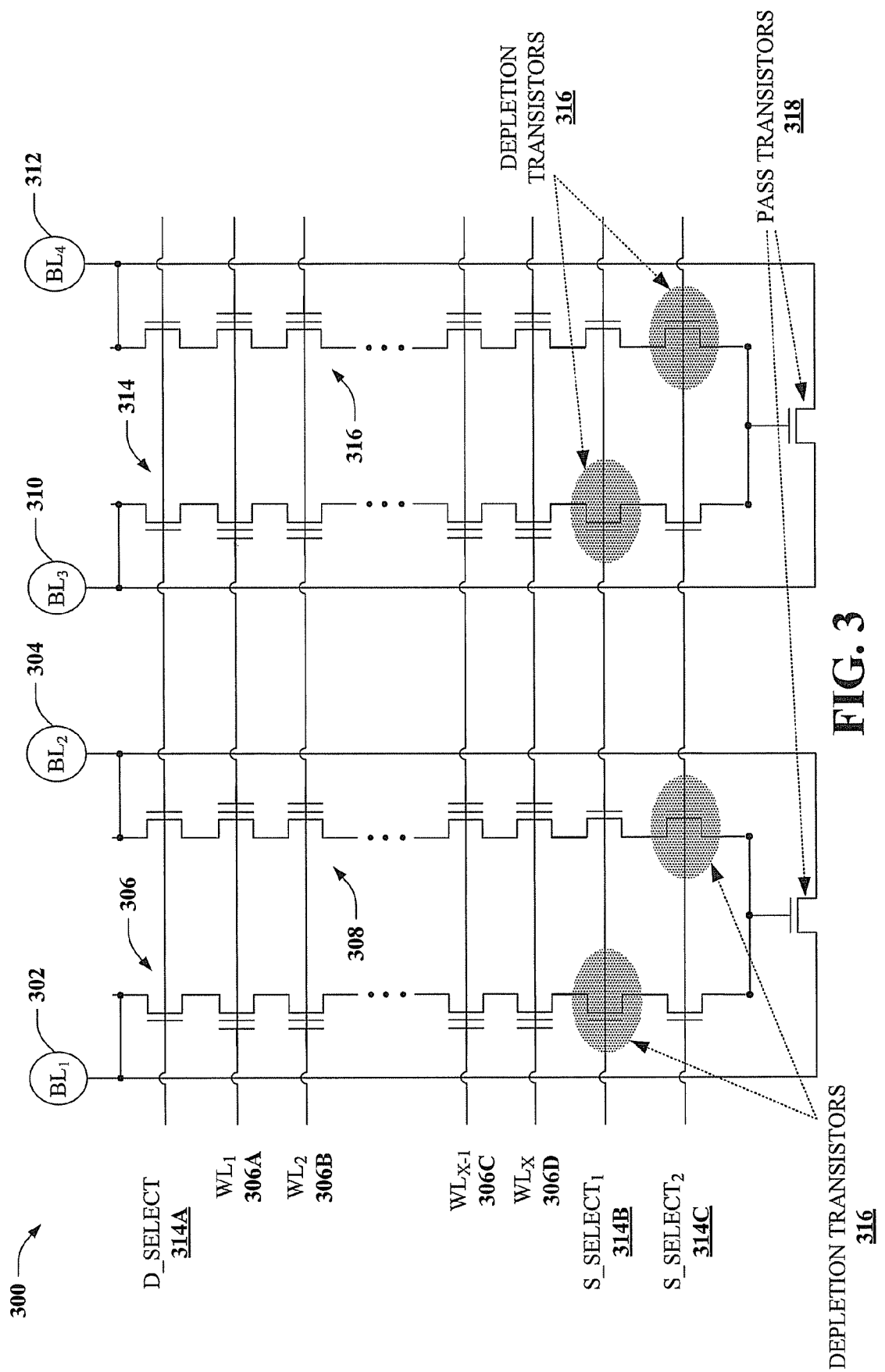
FIG. 3 illustrates a schematic diagram of a sample portion of a block of semiconductor transistor arrays according to a further aspect disclosed herein.

FIG. 3 illustrates a schematic diagram of an example semiconductor memory architecture 300 according to still other aspects of the subject disclosure. Semiconductor memory architecture 300 depicts a block of memory transistor arrays, comprising paired arrays coupled with respective pass transistors. It should be appreciated that semiconductor memory architecture 300 is not limited to two pairs of memory transistor arrays, however.

Semiconductor memory architecture 300 comprises four metal bitlines, including $BL_1$ 302, $BL_2$ 304, $BL_3$ 310 and $BL_4$ 312. Each metal bitline is electrically connected to an array of memory transistors, including arrays 306, 308, 314 and 316. These arrays 306, 308, 314, 316 have respective channel regions comprising respective arrays of active bitlines formed into a substrate of semiconductor memory architecture 300, and respective gates formed by a set of wordlines and a set of select lines. Particularly, the set of wordlines comprises $WL_1$ 306A, $WL_2$ 306B . . . $WL_{X-1}$ 306C, $WL_X$ 306D, where X is a positive integer greater than three, that form gates of memory transistors of memory transistor arrays 306, 308, 314, 316. Further, a D_Select line 314A is employed to form gates for select transistors in arrays 306, 308, 314, 316 that can be utilized to electrically connect or insulate respective arrays with respective metal bitlines 302, 304, 310, 312, for programming, erasing or reading memory transistors of the arrays 306, 308, 314, 316.

Additionally, a pair of string select wordlines S_Select$_1$ 314B and S_Select$_2$ 314C are formed to create gates for select transistors and depletion transistors 316. By applying suitable voltages to S_Select$_1$ 314B and S_Select$_2$ 314C, one array of each pair of arrays can be electrically isolated or connected to one of pass transistors 318. For instance, memory array 306 can be electrically connected to one of pass transistors 318 by deactivating (setting to non-conducting) S_Select$_1$ 314B and activating (setting to conducting) S_Select$_2$ 314C. Once electrically connected, memory transistors of memory array 306 can be read to determine program or erase states thereof, as described herein.

Figure 4:
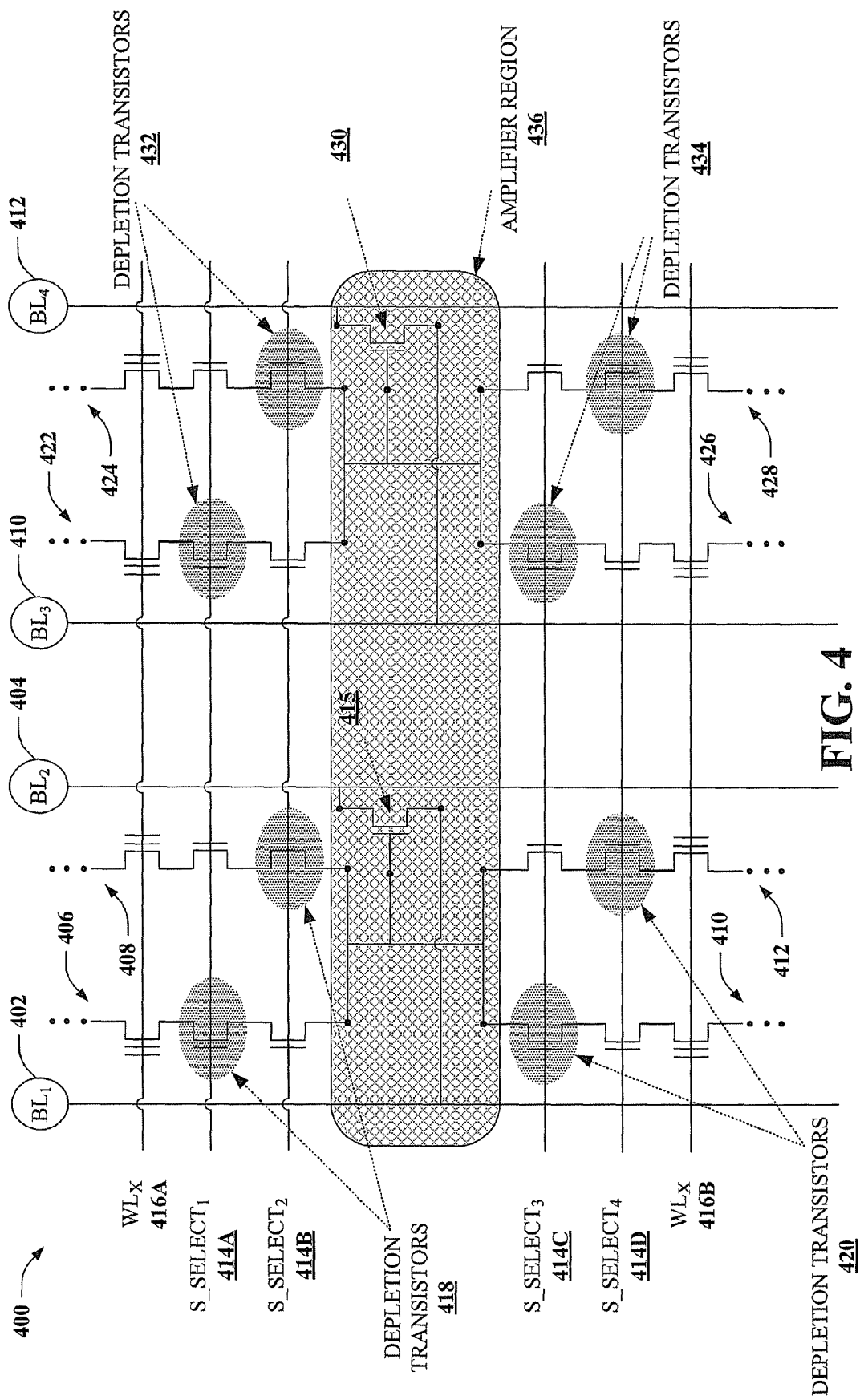
FIG. 4 depicts a schematic diagram of an example semiconductor memory architecture comprising differential sensing for four transistor arrays.

FIG. 4 illustrates a schematic diagram of a semiconductor memory architecture 400 according to yet another aspect of the subject disclosure. Semiconductor memory architecture 400 can provide increased memory density over semiconductor memory architecture 100 or semiconductor memory architecture 200, by decreasing a ratio of pass transistors to memory transistor arrays even further than the above semiconductor memory architectures. For instance, a single pass transistor can be employed for reading at least four memory transistor arrays of semiconductor memory architecture 400. This provides greater number of memory transistors for a given amount of semiconductor space in a memory device. In at least one aspect of the subject disclosure, the memory density of semiconductor memory architecture is $5.52 F^2$, and in another aspect the memory density is $5.4 F^2$.

As depicted, semiconductor memory architecture 400 comprises at least four metal bitlines $BL_1$ 402, $BL_2$ 404, $BL_3$ 410 and $BL_4$ 412. These metal bitlines intersect multiple blocks of memory transistors, each block comprising multiple pairs of parallel or substantially parallel arrays of memory transistors. An upper block of memory transistors (top half of the figure) comprises memory transistor array 406 connected with metal bitline $BL_1$ 402, memory transistor array 408 connected with metal bitline $BL_2$ 404, memory transistor array 422 connected with $BL_3$ 410, and memory transistor array 424 connected with $BL_4$ 412. A lower block of memory transistors (bottom half of the figure) comprises memory transistor array 410 connected with $BL_1$ 402, memory transistor array 412 connected with $BL_2$ 404, memory transistor array 426 connected with $BL_3$ 410, and memory transistor array 428 connected with $BL_4$ 412.

The upper block of memory transistors have memory transistor gate layers formed by wordlines up through $WL_X$ 416A, and two string select lines S_Select$_1$ 414A and S_Select$_2$ 414B. The upper block of memory transistors comprises depletion transistors 418 and 432 formed on the string select wordlines as depicted by the shaded ovals. The depletion transistors 418 enable memory transistor arrays 406 and 408 to be alternatively connected with a pass transistor 414, as described herein. Pass transistor 415 is coupled to $BL_1$ 402 and $BL_2$ 404 at opposing ends of a channel region of pass transistor 415. This enables differential sensing of a memory transistor(s) of memory transistor array 406 or memory transistor 408 (whichever is electrically connected to a gate of pass transistor 415 via string select gates S_Select$_1$ 414A and S_Select$_2$ 414B), also as described herein. Likewise, depletion transistors 432 enable memory transistor arrays 422 and 424 to be alternatively electrically connected to a second pass transistor 430. Pass transistor 430 has a channel region connected at opposing ends thereof to $BL_3$ 410 and $BL_4$ 412. Differential sensing of memory transistors electrically connected to pass transistor 430 via S_Select$_1$ 414A and S_Select$_2$ 414B can be performed by measuring a relative electrical characteristic of $BL_3$ 410 and $BL_4$ 412 (e.g., relative voltage or relative current).

For the lower block of memory transistors, memory transistor gates are formed by a series of wordlines up through and including $WL_X$ 416B. Two select wordlines are formed in the lower block of memory transistors S_Select$_3$ 414C and S_Select$_4$ 414D, which include depletion transistors 420 and 434. Depletion transistors 420 enable selective connection of memory transistor array 410 or memory transistor array 412 to pass transistor 415. Likewise, depletion transistors 434 enable selective connection of memory transistor array 426 or memory transistor array 428 to pass transistor 430. Memory transistors of memory transistor arrays 410 and 412 or memory transistor arrays 426 and 428 can be read by differential sensing of BL1 402 and BL$_2$ 404, or BL$_3$ 410 and BL$_4$ 412, respectively, as described herein.

The large semi-rectangular shaded region of semiconductor memory architecture 400 is referred to as an amplifier region 436. Amplifier region 436 includes pass transistor 415 and pass transistor 430, metal bitline contacts from the respective pass transistors to BL1 402 and BL$_2$ 404, and BL$_3$ 410 and BL$_4$ 412, respectively, and connections between the memory transistor arrays and the pass transistors. A semiconductor material diagram of amplifier region 436 is depicted in more detail at FIG. 5, infra.

Figure 5:
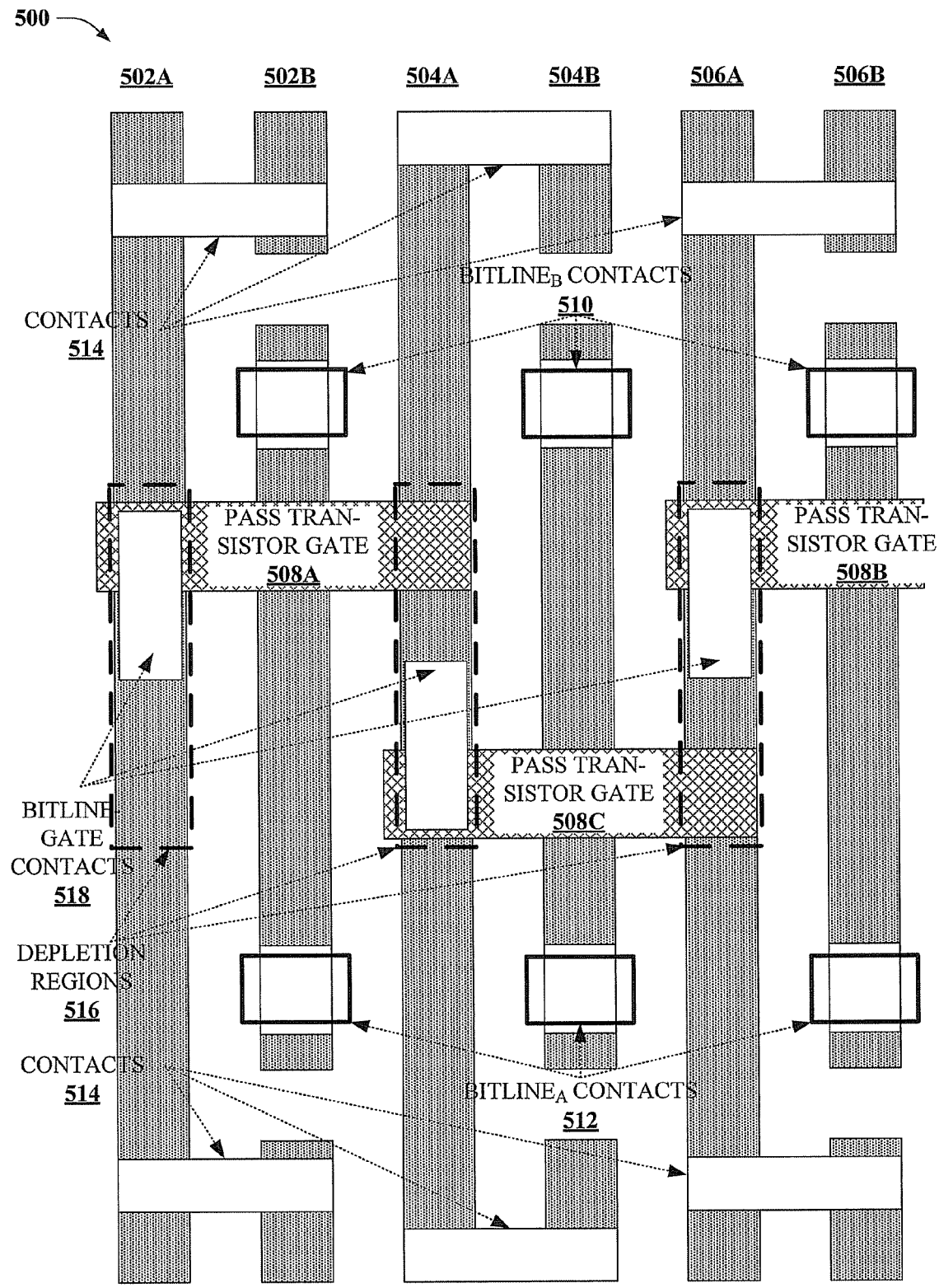
FIG. 5 illustrates a layout representation of an example amplifier region for the example semiconductor memory architecture having four transistor arrays.

FIG. 5 illustrates a layout representation of an example amplifier region 500 of a semiconductor memory device according to particular aspects of the subject disclosure. In at least one aspect, amplifier region corresponds with the shaded semi-rectangular amplifier region 436 of FIG. 4, supra. It should be appreciated, however, that amplifier region 436 can include more or fewer components than are detailed in amplifier region 500, or vice versa.

Amplifier region 500 can comprise a series of active bitlines 502A, 502B, 504A, 504B, 506A, 506B formed into a substrate of a semiconductor memory device. The top portion of amplifier region 500 can correspond with an upper block of memory transistor arrays and select transistors, and the bottom portion of amplifier region 500 can correspond with a lower block of memory transistor arrays and select transistors of the semiconductor memory device, similar to the schematic diagram of FIG. 4, supra. In a central portion of amplifier region 500, alternate active bitlines 502B, 504B and 506B are broken to prevent current flow from the central portion of these active bitlines to the upper or lower portions, as depicted by the break in the shaded rectangles delineating active bitlines 502B, 504B and 506B. Breaking can be implemented by digging, etching or otherwise removing semiconductor substrate material from the white regions (depicted in FIG. 5) above and below the central portion of these active bitlines 502B, 504B, 506B. In at least one aspect, an electrical insulator (e.g., silicon dioxide, another suitable oxide, or the like) can be placed (e.g., deposited) in the white regions to provide strong electrical insulation.

Electrical contacts 514 are formed between pairs of active bitlines, including active bitline pairs 502A and 502B, active bitline pairs 504A and 504B, active bitline pairs 506A and 506B, at the upper portion and lower portion of amplifier region 500. Pass transistor gates 508A, 508B, 508C are formed in the central portion of amplifier region 500. In some aspects of the subject disclosure, pass transistor gates 508A, 508B and 508C can be discrete gates, formed over only a subset of active bitlines of amplifier region 500. In one such aspect, the pass transistor gates can be formed over two of the active bitlines. In another such aspect, the pass transistor gates can be formed over three of the active bitlines.

Depletion regions 516 are formed in active bitlines 502A, 504A, 506A in a region of those active bitlines beneath pass transistor gates 508A, 508B and 508C. The depletion regions can be formed by implanting conductive material into the substrate of active bitlines 502A, 504A and 506A substantially within the dashed regions depicted by FIG. 5. Accordingly, depletion regions 516 are permanently conductive, and no semiconductor channel is formed beneath pass transistor gates 508A, 508B and 508C on active bitlines 502A, 504A and 506A, respectively. Pass transistors are formed on active bitlines 502B, 504B and 506B, however, as no depletion region is formed in these active bitlines. Accordingly, current flow in a channel region of these pass transistors is modulated by pass transistor gates 508A, 508B and 508C, respectively.

Once depletion regions 516 and pass transistor gates 508A, 508B, 508C are formed in amplifier region 500, the central regions of active bitlines 502B, 504B, 506B correspond with channel regions of the pass transistors. Two metal bitlines (not depicted), metal bitline$_A$ and metal bitline$_B$, of the semiconductor memory device are respectively connected to opposite ends of these pass transistor channel regions. As depicted, a first set of bitline contacts, bitline$_A$ contacts 512, is formed to connect one end of the respective pass transistor channel regions to metal bitlineA, and a second set of bitline contacts, bitlineB contacts 510, is formed to connect an opposite end of the respective pass transistor channel regions to metal bitlineB. In this manner, respective pass transistors can form respective junction switches to enable current to flow from metal bitlineA to metal bitlineB.

In addition to the foregoing, a set of bitline-gate electrical contacts 518 is formed between active bitlines 502A, 504A and 506A and pass transistor gates 508A, 508C and 508B, respectively. The bitline-gate electrical contacts 518 provide an electrical junction for as many as four memory transistor arrays per pass transistor. Thus, a memory transistor array formed in the upper portion of active bitline 502A, and a second memory transistor array formed in the lower portion of active bitline 502A can be connected to pass transistor gate 508A through this electrical junction. Additionally, a third memory transistor array formed in the upper portion of active bitline 502B and a fourth memory transistor array formed in the lower portion of active bitline 502B, can also be connected to pass transistor gate 508A (via contacts 514 formed between these active bitlines in the upper and lower portions, and the electrical junction). Memory transistor arrays formed in active bitlines 504A and 504B can be connected with pass transistor gate 508C, and memory transistor arrays formed in active bitline 506A and 506B can be connected with pass transistor gate 508B in a similar manner.

Program or erase states of a memory transistor array electrically coupled to a pass transistor can be measured by a relative voltage or relative current in the respective metal bitlines, or changes therein. Selection can start by activating a particular block of memory transistors (e.g., the upper block or lower block). Subsequently, select transistor gates for the activated block can be activated and deactivated to electrically connect one memory transistor array (e.g., memory transistor array 406 of FIG. 4, supra) of a pair of such arrays (e.g., memory transistor array 406 and memory transistor array 408) to a pass transistor gate (e.g., pass transistor gate 508A), and electrically isolate a second memory transistor array (e.g., memory transistor array 408) of the pair of such arrays from the pass transistor gate. Once a particular memory transistor array is connected to the pass transistor gate, a relative measurement of the metal bitlines (connected to opposite ends of a channel of the pass transistor, such as at the bitline$_B$ contact 510 and bitline$_A$ contact 512, respectively, of active bitline 502B) can be utilized to read a state of one or more memory transistors of the particular memory transistor array.

Figure 6:
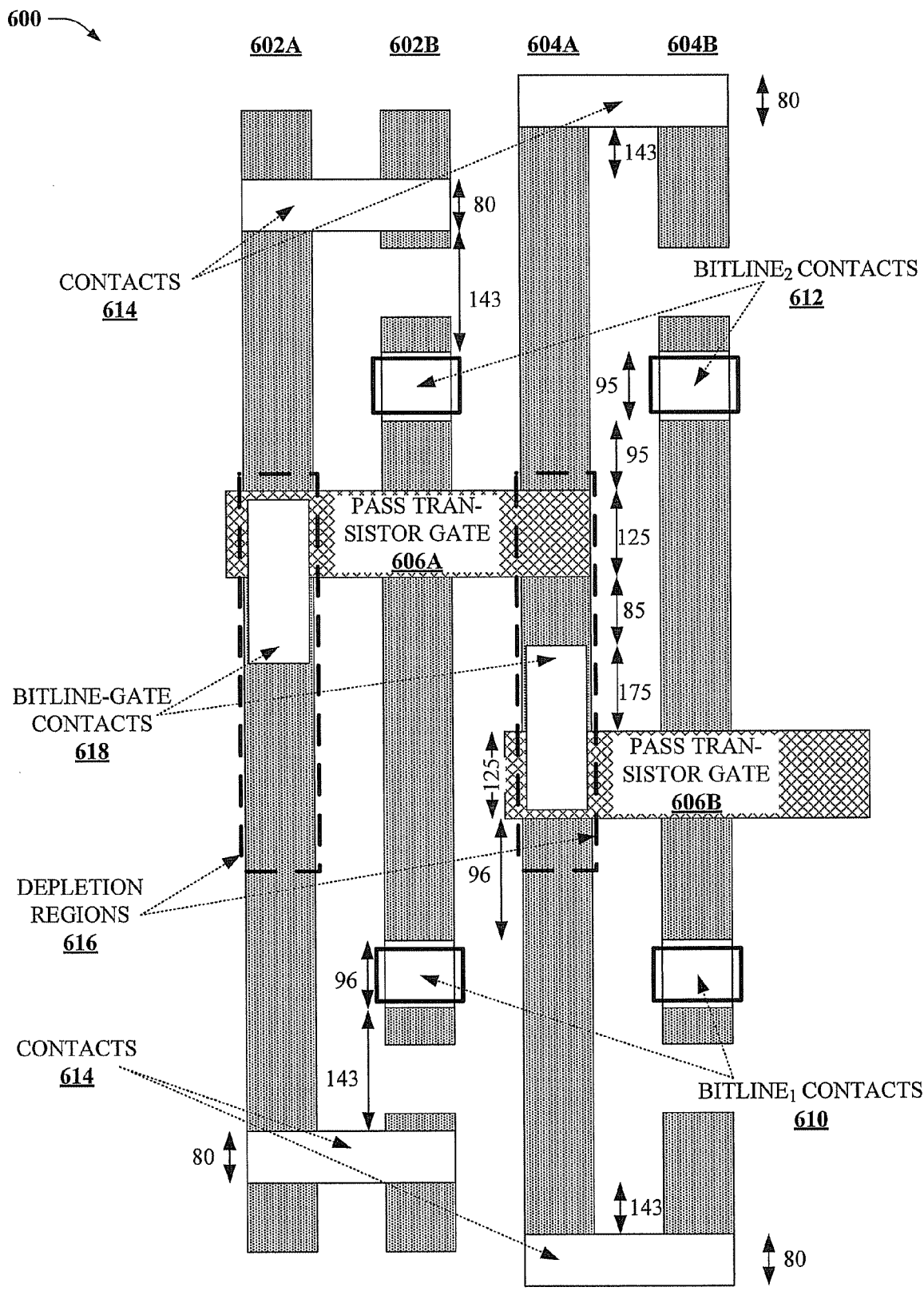
FIG. 6 illustrates a layout representation of a sample amplifier region of a semiconductor memory architecture according to particular disclosure aspects.

FIG. 6 depicts a layout representation of an example amplifier region 600 of a semiconductor memory device according to specific aspects of the subject disclosure. Amplifier region 600 can be one specific example of amplifier region 436 of FIG. 4, supra, for instance. However, it is to be appreciated that neither amplifier region 436 nor amplifier region 600 are so limited; rather, amplifier region 436 can include other embodiments than that depicted by amplifier region 600, and likewise amplifier region 600 can be implemented in conjunction with other semiconductor memory architectures than that depicted by semiconductor memory architecture 400.

As depicted, amplifier region 600 comprises a series of active bitlines, including active bitlines 602A, 602B, 604A and 604B. Electrical contacts 614 electrically connect pairs of active bitlines, including active bitlines 602A and 602B, and active bitlines 604A and 604B, above and below a central portion of amplifier region 600. Within the central portion, an electrically isolated region of active bitlines 602B and 604B comprise channel regions of pass transistors, formed by the respective isolated active bitlines and pass transistor gates 606A and 606B, respectively. A lower portion of these channel regions (e.g., a drain of the pass transistors) is connected with a set of contacts with a first metal bitline, bitline$_1$ contacts 610, and an upper portion of these channel regions (e.g., a source of the pass transistors) is connected with a set of contacts with a second metal bitline, bitline$_2$ contacts 612. The channel regions of these pass transistors can therefore cause current to flow between the first and second metal bitlines, based on a gate voltage of pass transistor gate 606A or pass transistor gate 606B, which in turn are controlled by current of active bitlines 602A or 602B, or 604A or 604B, respectively.

Pairs of active bitlines are connected with the pass transistor gates. This is accomplished first by forming a depletion region in alternate active bitlines 602A and 604A substantially beneath pass transistor gates 606A and 606B. In addition, bitline-gate contacts 618 are formed between active bitlines 602A and 604A and pass transistor gates 606A and 606B, respectively. In this manner current in active bitlines 602A and 602B can control the gate voltage of pass transistor gate 606A, and current in active bitlines 604A and 604B can control the gate voltage of pass transistor gate 606B.

As depicted, FIG. 6 provides specific dimensions for example amplifier region 600. It should be appreciated that not all of the listed dimensions need be utilized in various aspects of the subject disclosure. Particularly, some dimensions can be utilized in conjunction with other suitable dimensions. Further, proportional dimensions can be employed instead of those listed (e.g., 0.9× the listed dimensions, 0.75× the listed dimensions, 1.1× the listed dimensions, 1.25× the listed dimensions, etc.). Additionally, it should be understood that FIG. 6 is not drawn to scale.

Starting from the bottom of amplifier region 600, the electrical contact between active bitline 604A and active bitline 604B can be 80 micrometers (μm) in width. A spacing between this electrical contact and the electrical contact between active bitline 602A and active bitline 602B can be 143 μm, and the latter electrical contact can also be 80 μm in width.

Further to the above, a spacing between the electrical contact between active bitline 602A and active bitline 602B and bitline$_1$ contacts 610 can be 143 μm, and a spacing between bitline$_1$ contacts 610 and a lower portion of bitline-gate contact connected to pass transistor gate 606B can be 96 μm. A width of pass transistor gate 606B can be 125 μm, and a distance between pass transistor gate 606B and an upper portion of bitline-gate contact connected to pass transistor gate 606B can be 175 μm, and a distance between this upper portion of the bitline-gate contact and pass transistor gate 606A can be 85 μm, the latter also being 125 μm in width.

The upper portion of amplifier region 600 can be dimensionally symmetric with the lower portion thereof. Accordingly, a distance between pass transistor gate 606A and bitline$_2$ contacts 612 can be 95 μm, which can also be 95 μm in width. A distance between bitline$_2$ contacts 612 and the electrical contact between active bitline 602A and active bitline 602B can be 143 μm. The width of active this electrical contact can be 80 μm. Additionally, a distance between the electrical contact between active bitline 602A and 602B and the electrical contact between active bitline 604A and 604B can be 143 μm. Further, the latter electrical contact can also be 80 μm in width.

The aforementioned diagrams have been described with respect to interaction between several components, or memory architectures. It should be appreciated that such diagrams and architectures can include those architectures specified therein, some of the specified architectures, and/or additional architectures. For example, a semiconductor architecture could include a combination of amplifier region 600, in conjunction with semiconductor memory architecture 400. Sub-components could also be implemented as architectures electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. Components of the disclosed architectures can also interact with one or more other components not specifically described herein but known by those of skill in the art.

Figure 7:
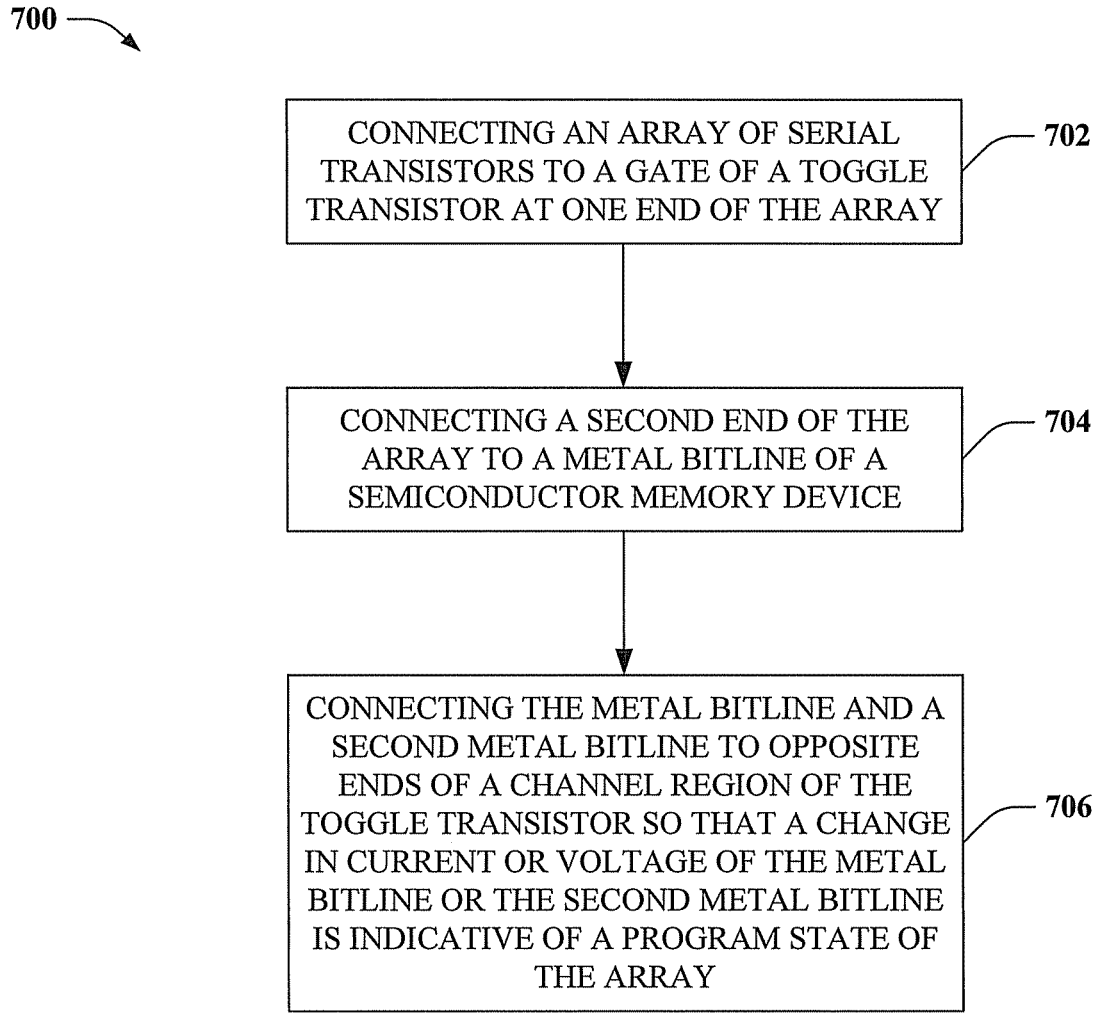
FIG. 7 depicts a flowchart of a sample methodology for fabricating a semiconductor memory architecture of the subject disclosure.
Figure 8:
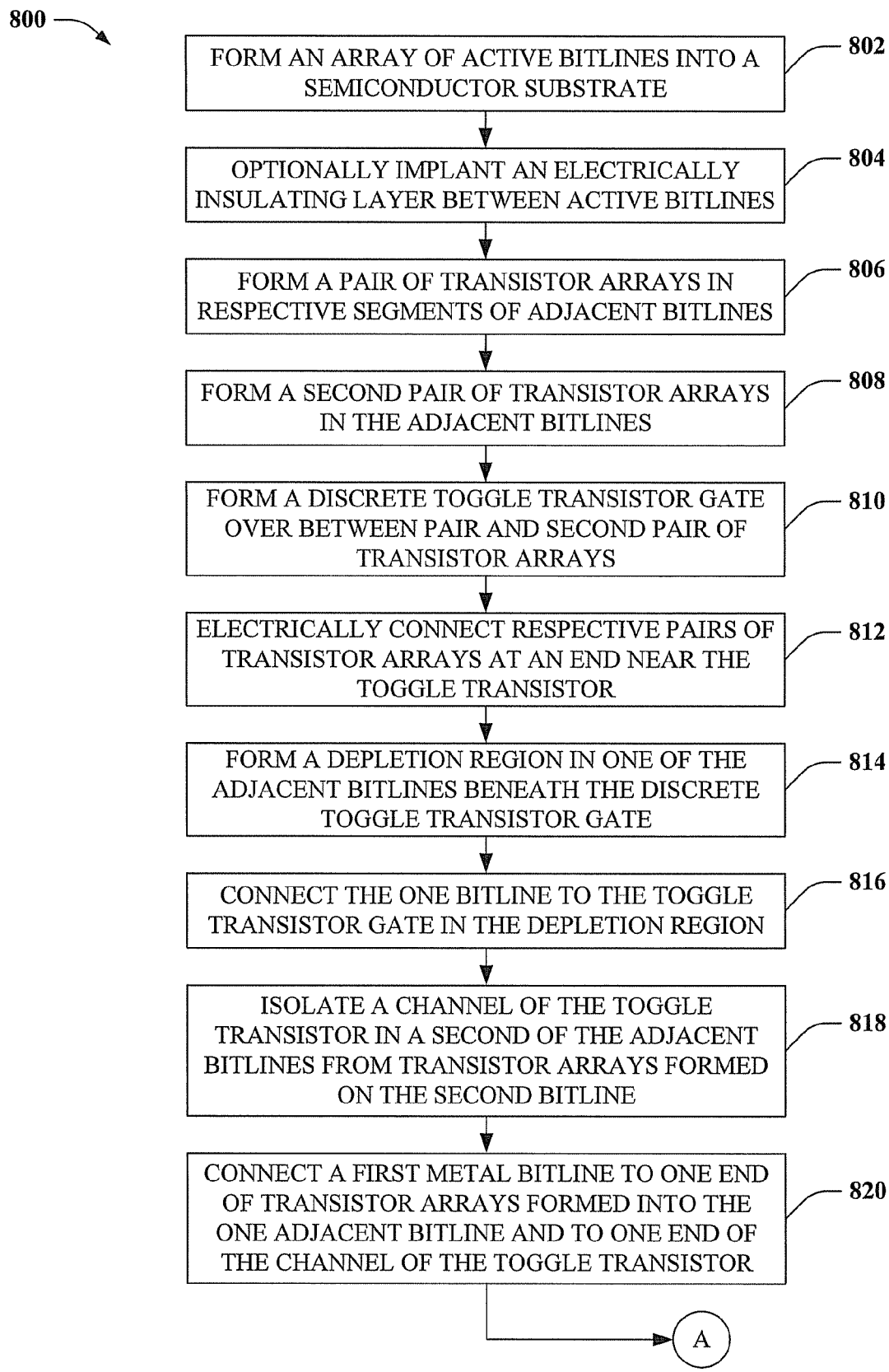
FIGS. 8 and 9 illustrate a flowchart of an example methodology for forming a semiconductor architecture according particular disclosed aspects.
Figure 9:
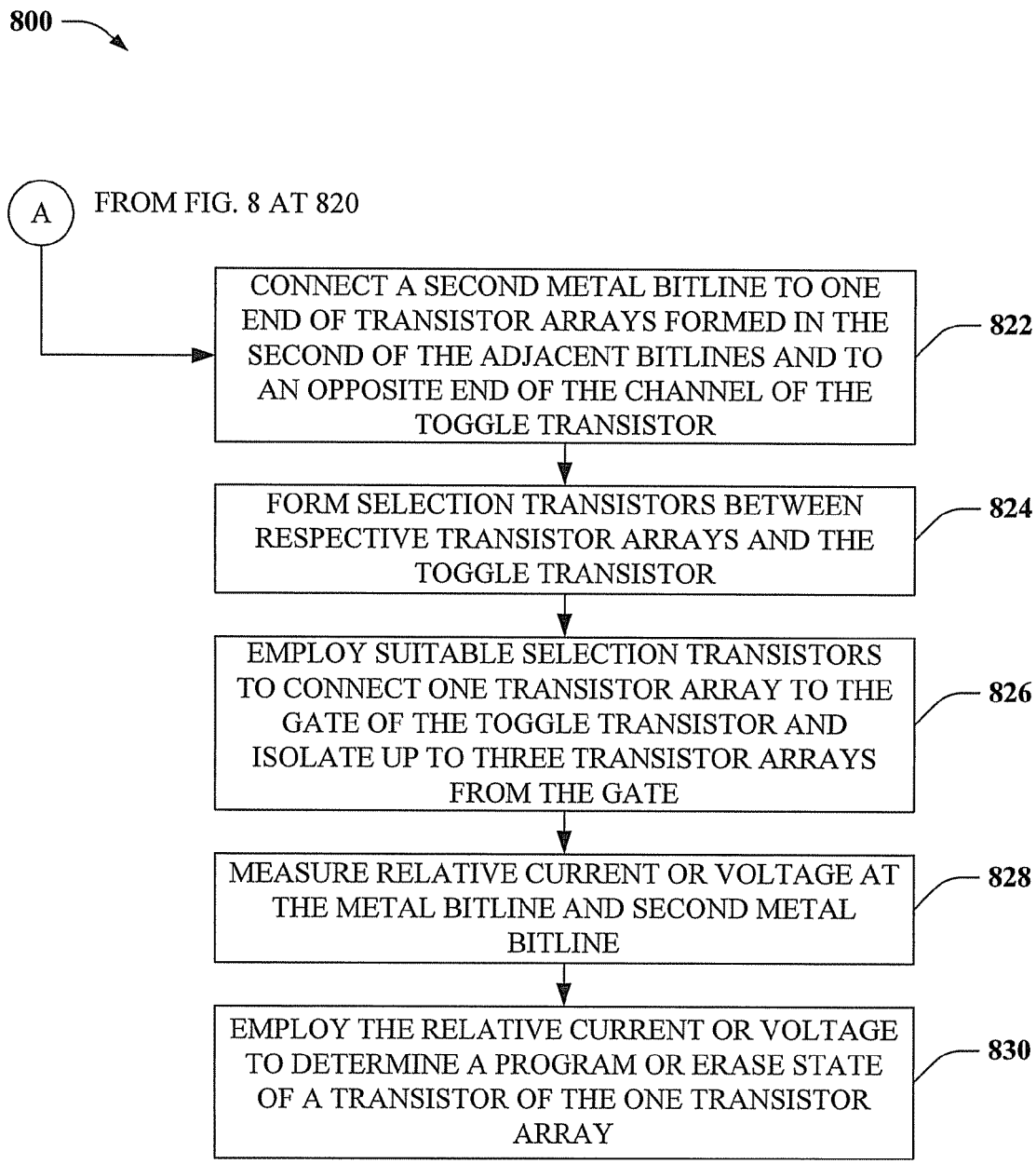

In view of the exemplary diagrams described supra, process methodologies that may be implemented in accordance with the disclosed subject matter will be better appreciated with reference to the flow charts of FIGS. 7-9. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter. Additionally, it should be further appreciated that the methodologies disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 7 depicts a flowchart of an example methodology 700 for fabricating a semiconductor memory device according to particular aspects of the subject disclosure. At 702 method 700 can comprise connecting an array of memory transistors arranged electrically in serial, to a gate of a toggle transistor (also referred to herein as a pass transistor) at one end of the array. The toggle transistor is configured to conduct or isolate current flow through a channel region of the toggle transistor. Additionally, at 704, method 700 can comprise connecting a second end of the array to a metal bitline of the semiconductor memory device. Furthermore, at 706, method 700 can comprise connecting the metal bitline and a second metal bitline of the semiconductor memory device to opposite ends of the channel region of the toggle transistor. Particularly, the metal bitlines are connecting to the channel region of the toggle transistor such that a change in an electrical characteristic (e.g., current, voltage, etc.) of the metal bitline or the second metal bitline is indicative of a program state or an erase state of the array. For instance, the metal bitline can be connected to a source of the channel region, and the second metal bitline can be connected to a drain of the channel region. In this manner, when a gate voltage of the toggle transistor exceeds a threshold voltage, the channel region of the toggle transistor will conduct current between the metal bitline and the second metal bitline, potentially causing a measurable change in the electrical characteristic. Because the gate voltage of the toggle transistor is controlled by accumulation of charge from the array of memory transistors, a program state or erase state of memory transistors of the array can lead to current flow in the toggle transistor. Accordingly, the program or erase state can be determined from a change in the electrical characteristic of the metal bitline relative the second metal bitline.

Methodology 700 can result in a memory transistor array having fast program and erase times, as well as fast read times. In one aspect, the toggle transistor can be selected to have low capacitance or low resistance, to further improve read times of the memory transistor array. In another aspect, the metal bitline and second metal bitline can be configured to have low resistance or low relative capacitance to also further improve read times of the memory transistor array. In at least one aspect, a combination of the foregoing aspects can be employed as well.

FIGS. 8 and 9 illustrate a flowchart of an example methodology 800 for fabricating a semiconductor memory device according to still other aspects of the subject disclosure. At 802, method 800 can comprise forming an array of active bitlines into a semiconductor substrate of the semiconductor memory device. At 804, method 800 can comprise optionally implanting an electrically insulating layer between active bitlines. At 806, method 800 can comprise forming a pair of memory transistor arrays in a segment of adjacent bitlines. At 808, method 800 can comprise forming a second pair of transistor arrays in a second segment of the adjacent bitlines.

Further to the above, at 810, method 800 can comprise forming a discrete toggle transistor gate over the adjacent bitlines between the segment and the second segment of the adjacent bitlines. At 812, method 800 can comprise electrically connecting respective pairs of memory transistor arrays at ends thereof near the toggle transistor gate. At 814, method 800 can comprise forming a depletion region in one of the adjacent active bitlines beneath the discrete toggle transistor gate. The depletion region can be formed by causing the one adjacent active bitline to be permanently conductive beneath the discrete toggle transistor gate. In at least one aspect, this depletion region can be created by doping the depletion region with conductive material.

At 816, method 800 can comprise electrically connecting the one adjacent active bitline to the gate of the toggle transistor. Particularly, the electrical contact can be from the depletion region to the gate of the toggle transistor. At 818, method 800 can comprise isolating a channel of the toggle transistor in a second of the adjacent active bitlines from transistor arrays formed on the second active bitline. Isolating the channel of the toggle transistor can comprise digging, etching or otherwise removing semiconductor material from the second active bitline between the channel of the toggle transistor and memory transistor arrays formed in the second active bitline. In at least one aspect, an insulating material, such as an oxide material, can be implanted into the second active bitline in a region where the semiconductor material is dug out, etched or removed.

At 820, method 800 can comprise connecting a first metal bitline to one end of memory transistor arrays formed into the one adjacent bitline and to one end of the channel region of the toggle transistor. From 820, method 800 proceeds to 822 of FIG. 9. At 822, method 800 can comprise connecting a second metal bitline to one end of transistor arrays formed in the second of the adjacent bitlines and to an opposite end of the channel of the toggle transistor. At 824, method 800 can comprise forming selection transistors between respective transistor arrays and the toggle transistor. At 826, method 800 can comprise employing suitable selection transistors to electrically connect one transistor array to the gate of the toggle transistor and isolate up to three transistor arrays from the gate of the toggle transistor. At 828, method 800 can comprise measuring relative current or relative voltage at the metal bitline and second metal bitline. At 830, method 800 can comprise employing the relative current or relative voltage to determine a program or erase state of a transistor of the one transistor array.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" "has" or "having" are used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/ or display devices.

Figure 10:
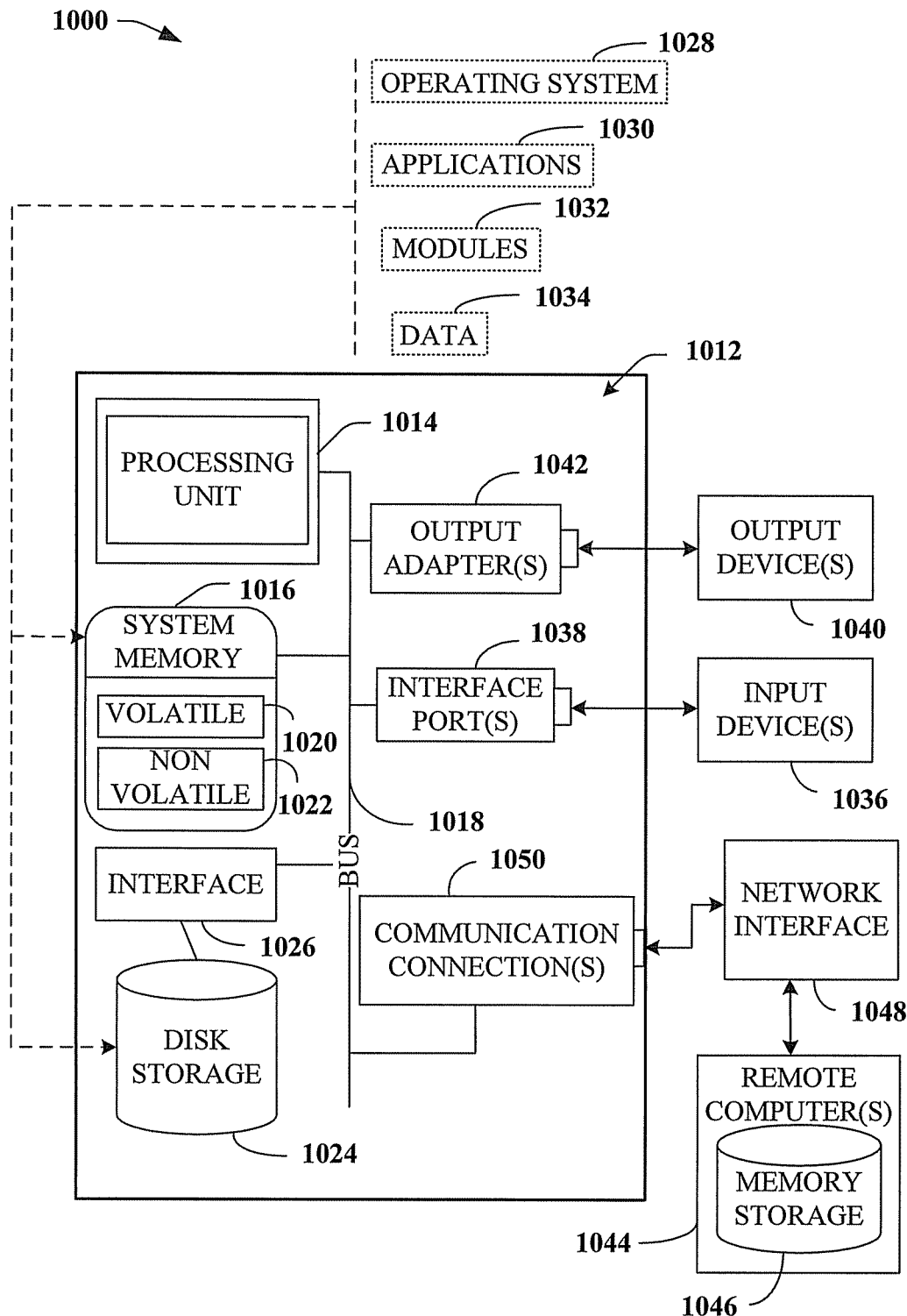
FIG. 10 illustrates a block diagram of an example processing system for utilizing or accessing non-volatile memory according to general disclosed aspects.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methodologies for manipulating semiconductor devices of such architectures, those skilled in the art will recognize that the subject innovation also may be implemented in combination with other architectures or process methodologies. Moreover, those skilled in the art will appreciate that the inventive processes may be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on standalone electronic devices, such as a Flash memory module. In a distributed computing environment, program modules may be located in both local and remote memory storage modules or devices.

With reference to FIG. 10, a suitable environment 1000 for implementing various aspects of the claimed subject matter can include a host computer 1012. The host computer 1012 includes a processing unit 1014, a system memory 1016, and a system bus 1018. The system bus 1018 connects system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include ROM, PROM, EPROM, EEPROM, or Flash memory (e.g., AND Flash, NAND Flash, NOR Flash, CT-NOR Flash, CT-NAND Flash, and so on). Furthermore, nonvolatile memory 1022 can provide the platform for the various semiconductor architectures described herein. Volatile memory 1020 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Host computer 1012 also includes removable/non-removable, volatile/non-volatile computer storage media. FIG. 10 illustrates, for example, a disk storage 1024. Disk storage 1024 includes, but is not limited to, devices like a magnetic disk drive, floppy disk drive, tape drive, Jaz drive, Zip drive, LS-100 drive, flash memory card, or memory stick. In addition, disk storage 1024 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). Furthermore, disk storage 1024 can provide the platform for the various semiconductor architectures described herein. To facilitate connection of the disk storage devices 1024 to the system bus 1018, a removable or non-removable interface is typically used, such as interface 1026.

It is to be appreciated that FIG. 10 describes software that acts as an intermediary between users and the basic computer resources described in the suitable operating environment 1000. Such software includes an operating system 1028. Operating system 1028, which can be stored on disk storage 1024, acts to control and allocate resources of the host computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user enters commands or information into the host computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to host computer 1012 and to output information from host computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Host computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to host computer 1012. For purposes of brevity, only a memory storage device 1046 is illustrated with remote computer(s) 1044. Remote computer(s) 1044 is logically connected to host computer 1012 through a network interface 1048 and then physically connected via communication connection 1050. Network interface 1048 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1050 is shown for illustrative clarity inside host computer 1012, it can also be external to host computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes. In addition, while a particular feature may have been disclosed with respect to only one of several implementations, such feature may be combined with one or more other features of the other implementations as may be desired and advantageous for any given or particular application.

What is claimed is:

1. A semiconductor memory device, comprising:
    a first array of transistors arranged electrically in serial from source to drain, one end of the first array is electrically coupled to a gate of a pass transistor and an opposite end of the first array is electrically coupled to a metal bitline of the semiconductor memory device; and
    a second metal bitline coupled to a first end of a channel region and the metal bitline coupled to a second end of the channel region of the pass transistor, wherein a state of a transistor of the first array of transistors is determined from a difference in an electrical characteristic of the metal bitline relative to the second metal bitline.

2. The semiconductor memory device of claim 1, further comprising a sense amplifier circuit coupled to both the metal bitline and the second metal bitline that measures the difference in the electrical characteristic.

3. The semiconductor memory device of claim 1, wherein the electrical characteristic is a relative voltage, relative current, relative transient current or voltage of the metal bitline with respect to the second metal bitline.

4. The semiconductor memory device of claim 1, wherein the electrical characteristic is based at least in part on a voltage polarity or a direction of current flow for the metal bitline relative the second metal bitline.

5. The semiconductor memory device of claim 1, further comprising a second array of transistors arranged electrically in serial from source to drain, one end of the second array is electrically coupled to the gate of the pass transistor.

6. The semiconductor memory device of claim 5, wherein a second end of the second array is electrically coupled to the second metal bitline.

7. The semiconductor memory device of claim 5, wherein the first array of transistors and the second array of transistors are electrically coupled to the pass transistor and are both programmed and read based on voltages applied on the WLs, D-select, S-select, gate of the pass transistor or based on a relative voltage or current of the metal bitline and the second metal bitline, or a combination thereof.

8. The semiconductor memory device of claim 5, further comprising a first string select wordline configured to toggle current flow on or off for the second array of transistors, and configured to conduct current flow for the first array of transistors, wherein the first string select wordline can isolate the second array of transistors from the gate of the pass transistor enabling programming or reading the first array of transistors.

9. The semiconductor memory device of claim 8, further comprising a second string select wordline configured to toggle current flow on or off for the first array of transistors, and configured to conduct current flow for the second array of transistors, wherein the second string select wordline can isolate the first array of transistors from the gate of the pass transistor enabling programming or reading the second array of transistors.

10. The semiconductor memory device of claim 9, further comprising a third array of transistors arranged electrically in serial from source to drain, one end of the third array is electrically coupled to the gate of the pass transistor.

11. The semiconductor memory device of claim 10, further comprising a third string select wordline configured to conduct current flow for the third array of transistors and configured to connect or isolate at least one additional array of transistors to or from, respectively, the gate of the pass transistor, wherein the third array of transistors is programmed or read when the first array, the second array and the at least one additional array are isolated from the gate of the pass transistor.

12. The semiconductor memory device of claim 9, wherein the at least one additional array of transistors is a fourth array of transistors arranged electrically in serial from source to drain, one end of the fourth array is electrically coupled to the gate of the pass transistor.

13. The semiconductor memory device of claim 12, further comprising a fourth string select wordline configured to conduct current flow for the fourth array of transistors and configured to isolate the third array of transistors from the gate of the pass transistor, wherein the fourth array of transistors is programmed or read when:
    the first array, the second array and the third array are isolated from the gate of the pass transistor by the second string select wordline, the first string select wordline and the fourth string select wordline, respectively; and
    the third string select wordline electrically connects the fourth array to the gate of the pass transistor.

14. A method of fabricating a semiconductor memory device, comprising:
- connecting an array of transistors that are arranged electrically in serial to a gate of a toggle transistor at one end of the array;
- connecting a second end of the array to a metal bitline of the semiconductor memory device; and
- connecting the metal bitline and a second metal bitline of the semiconductor memory device to opposite ends of a channel region of the toggle transistor, wherein a change in current or voltage of the metal bitline relative the second metal bitline is indicative of a program or erase state of one or more transistors of the array.

15. The method of claim 14, further comprising electrically isolating or connecting the metal bitline and the second metal bitline via a gate voltage of the toggle transistor.

16. The method of claim 15, further comprising:
- selecting a transistor of the array;
- electrically connecting a channel of the transistor to the gate of the toggle transistor;
- measuring the change in current or voltage of the metal bitline relative the second metal bitline; and
- determining whether the transistor is in the program state or the erase state based on the change.

17. The method of claim 14, further comprising:
- connecting a second array of transistors to the gate of the toggle transistor at one end of the second array;
- connecting another end of the second array to the second metal bitline; and
- selectively connecting or isolating the array or the second array from the gate of the toggle transistor to facilitate programming, erasing or reading a transistor of the array or of the second array, respectively.

18. The method of claim 17, further comprising:
- forming a plurality of wordlines on the array of transistors and the second array of transistors, wherein at least one transistor formed by the plurality of wordlines on the array of transistors and on the second array of transistors, respectively, is a depletion transistor; and
- selectively connecting or isolating the array or the second array from the gate of the toggle transistor by activating different ones of the plurality of wordlines.

\* \* \* \* \*